United States Patent
Satoh et al.

(10) Patent No.: US 8,796,795 B2
(45) Date of Patent: Aug. 5, 2014

(54) MRAM WITH SIDEWALL PROTECTION AND METHOD OF FABRICATION

(75) Inventors: Kimihiro Satoh, Beaverton, OR (US); Yiming Huai, Pleasanton, CA (US); Jing Zhang, Los Altos, CA (US); Ebrahim Abedifard, Sunnyvale, CA (US)

(73) Assignee: Avalanche Technology Inc., Fremont, CA (US)

( * ) Notice: Subject to any disclaimer, the term of this patent is extended or adjusted under 35 U.S.C. 154(b) by 111 days.

(21) Appl. No.: 13/136,454

(22) Filed: Aug. 1, 2011

(65) Prior Publication Data

US 2013/0032907 A1 Feb. 7, 2013

(51) Int. Cl.
*H01L 27/24* (2006.01)
*H01L 27/22* (2006.01)
*H01L 45/00* (2006.01)

(52) U.S. Cl.
CPC .......... *H01L 27/222* (2013.01); *H01L 27/2436* (2013.01); *H01L 45/1233* (2013.01); *H01L 45/1675* (2013.01); *H01L 45/04* (2013.01); *H01L 45/06* (2013.01)
USPC ........... 257/421; 257/423; 257/424; 257/427; 257/368; 257/369; 257/370; 257/414; 257/295; 257/296; 257/303; 257/306; 365/158; 365/171; 365/173

(58) Field of Classification Search
CPC .................. H01L 27/228; H01L 2224/48227; H01L 2224/73265; H01L 27/222; H01L 2224/85; H01L 2225/0651; H01L 24/29; H01L 24/32; H01L 24/49; H01L 24/85; H01L 43/08; H01L 21/28273

USPC ......... 257/421, 422, 423, 424, 427, 368–370, 257/414, 295, 296, 303, 306; 365/158, 171, 365/173

See application file for complete search history.

(56) References Cited

U.S. PATENT DOCUMENTS

| | | | |
|---|---|---|---|
| 7,897,950 B2 | 3/2011 | Shoji | |
| 7,898,007 B2 | 3/2011 | Lee et al. | |
| 7,906,347 B2 | 3/2011 | Sato | |
| 7,919,794 B2 | 4/2011 | Gu et al. | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 7,989,224 B2 | 8/2011 | Gaidis | |
| 2008/0277703 A1* | 11/2008 | Iwayama | 257/295 |
| 2009/0127602 A1* | 5/2009 | Ozaki | 257/295 |
| 2010/0181654 A1* | 7/2010 | Fujiwara et al. | 257/632 |
| 2011/0254112 A1* | 10/2011 | Yamanaka et al. | 257/421 |

* cited by examiner

Primary Examiner — Chuong A Luu
(74) Attorney, Agent, or Firm — G. Marlin Knight

(57) ABSTRACT

BEOL memory cells are described that include one or more sidewall protection layers on the memory device (including, for example, an MTJ element) deposited prior to interconnect via etching to prevent the formation of electrical shorts between layers. One embodiment uses a single layer sidewall protection sleeve that is deposited after the memory device has been patterned. The layer material is vertically etched down to expose the upper surface of the top electrode while leaving a residual layer of protective material surrounding the rest of the memory device. The material for the protection layer is selected to resist the etchant used to remove the first dielectric material from the via in the subsequent interconnect process. A second embodiment uses dual-layer sidewall protection in which the first layer covers the memory element is preferably an oxygen-free dielectric and the second layer protects the first layer during via etching.

9 Claims, 9 Drawing Sheets

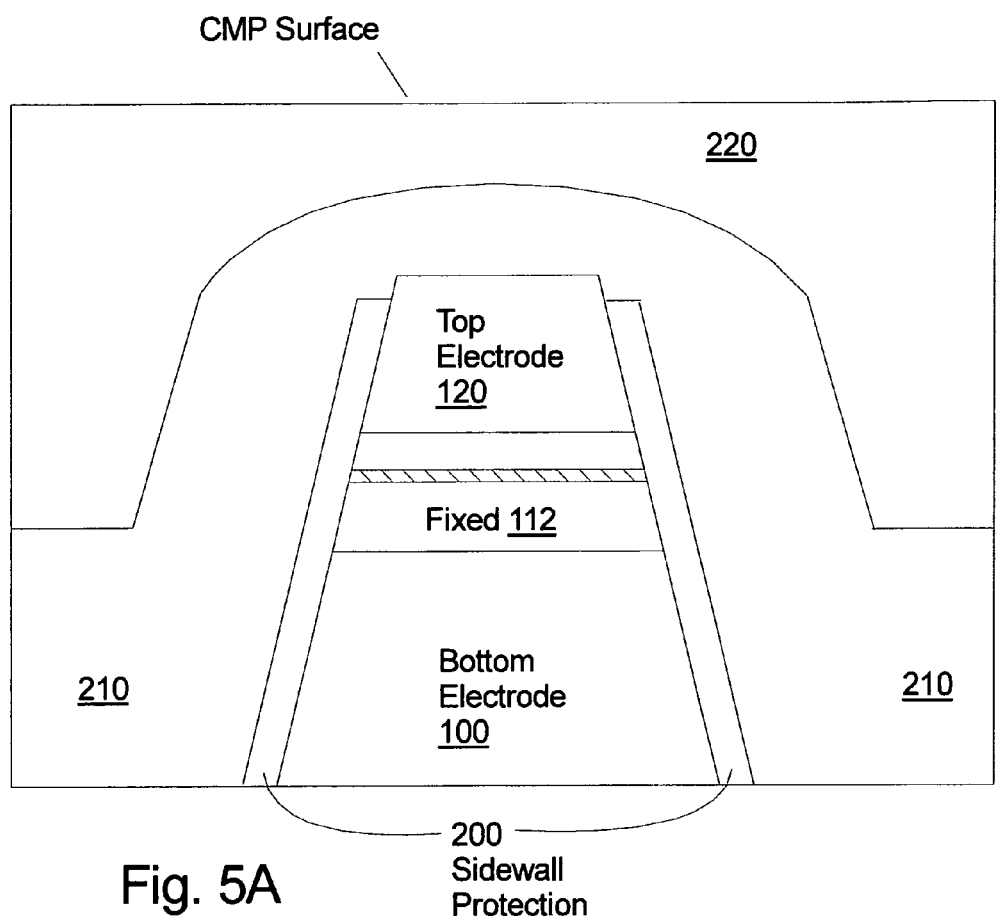

MRAM WITH SIDEWALL PROTECTION AND METHOD OF FABRICATION

FIELD OF THE INVENTION

The present invention relates generally to semiconductor Back-End-Of-Line (BEOL) memories and particularly to Magnetic Random Access Memory (MRAM) and particularly to protecting the memory elements from being shorted during the interconnect process.

DESCRIPTION OF THE PRIOR ART

The BEOL memories such as RRAM (Resistive Random Access Memory), PRAM (Phase Change Random Access Memory), MRAM have a resistive device as a memory element. Because high speed access and non-volatility at power off are promised by these devices, they may replace existing memories and create new markets.

The memory device consists of a top electrode, a bottom electrode and the resistive memory element in between. The bottom electrode is connected to a control device such as a transistor or a diode. After the layers of the memory device have been patterned, the top electrode is connected to a bit line in a series of process steps collectively referred to as BEOL process which creates metal interconnect wires that are insulated by dielectric material. Herein arises a problem with the prior art that can result in an electrical short being formed between the top and bottom electrodes during fabrication. The design trend for the resistive device is to scale down minimum feature size to minimize the cell area. The BEOL feature size is generally larger than the minimum feature size defined in FEOL (Front End Of Line) process. Therefore, when using a via hole to interconnect the resistive device to the bit line, there is no margin for the bit line to land on the top electrode. The sidewall of the memory element would be exposed by the via etch process. If the etching of the via reaches to the sidewall of the bottom electrode, then the subsequent metal deposition in the bit line interconnect process causes a short between the top electrode to the bottom electrode, thereby destroying the functionality of the device. This failure condition that can arise during prior art processing is illustrated FIG. 1.

The resistive device of MRAM is a MTJ (Magnetic Tunnel Junction) including a free layer, a fixed layer and a barrier layer in between. A magnetic moment of the free layer is manipulated to parallel or antiparallel to the fixed layer by applying an electric current. Whether the magnetic vector of the free layer is parallel or antiparallel to the fixed layer determines the low or high resistance state of the MTJ. The two resistance states are defined as memory state "0" or "1". Therefore, an electrical short that could happen when the via etch reaches down to the level of the barrier layer is a severe issue in this device.

In published US patent application 20100181654 by Fujiwara, et al. (Jul. 22, 2010) an insulating film, which will be called a borazinic film herein, for a semiconductor device is described. The film is described as having low permittivity, a low leak current, high mechanical strength, stability over time, and excellent water resistance. The process for forming the film uses a carrier gas and a raw material gas, which has borazine skeletal molecules. The insulating film includes cross-linked borazine skeletal molecules and is said to have both inorganic or organic properties.

SUMMARY OF THE INVENTION

Embodiments of the invention include one or more protection layers deposited on the sidewall of the memory device (including, for example, an MTJ element) prior to interconnect via etching to protect the sidewall during the via etching and prevent the formation of electrical shorts between the top and bottom electrodes. The invention is applicable to MRAM and other BEOL memories. Embodiments of the invention disclose a MTJ MRAM memory cell having one or more sidewall protection layers on a memory device sidewall and the fabrication method thereof. Two embodiments are described.

The first embodiment uses a single layer sidewall protection sleeve that is deposited after the memory device has been patterned. The bulk material for the protection sleeve layer is deposited and then vertically etched down to expose the upper surface of the top electrode while leaving a residual layer of protective material surrounding the rest of the memory device. The material for the protection sleeve layer is selected to resist the etchant used to remove the dielectric material from the via in the subsequent interconnect process. The interconnect process can be performed in the conventional manner.

The second embodiment uses dual-layer sidewall protection sleeve (or equivalently dual sleeves) in which the first layer covers the sidewalls of the memory element and the bottom electrode and the second layer protects the first layer during the via etch process. The first layer of the sidewall protection sleeve is formed in the same manner as described for the single layer in the first embodiment. However, the material for the first layer in this second embodiment is preferably an oxygen-free dielectric and does not need to be resistant to the etchants used during the interconnect process. After the first sidewall protection layer is vertically etched to expose the upper surface of the top electrode, the bulk material for the second layer of the sidewall protection sleeve is deposited over the device(s) on the wafer, then it is vertically etched to again expose the upper surface of the top electrode while leaving residual material on the sidewall. The material for the second protection layer is selected to resist the etchant used to remove the etch-stop dielectric material from the via in the subsequent interconnect process. The interconnect process can be performed in the conventional manner.

BRIEF DESCRIPTION OF THE FIGURES

FIGS. 3, 4A, 4B, 5A and 5B illustrate cross sectional views of selected stages of the fabrication process for a memory cell according to the first embodiment of the invention.

DETAILED DESCRIPTION OF THE INVENTION

In the following description of the embodiments, reference is made to the accompanying drawings that form a part hereof, and in which is shown by way of illustration of specific embodiments in which the invention may be practiced. It is to be understood that other embodiments may be utilized without departing from the scope of the present invention. It should be noted that the figures discussed herein are not drawn to scale and thicknesses of lines are not indicative of actual sizes. The cross section view in the figures is generally taken through the approximate center the memory cell in a plane perpendicular to the substrate except where otherwise noted. Although only one cell is shown in the figures, the method may used for the simultaneous fabrication of a many cells on a wafer according to standard techniques.

Figure 1:
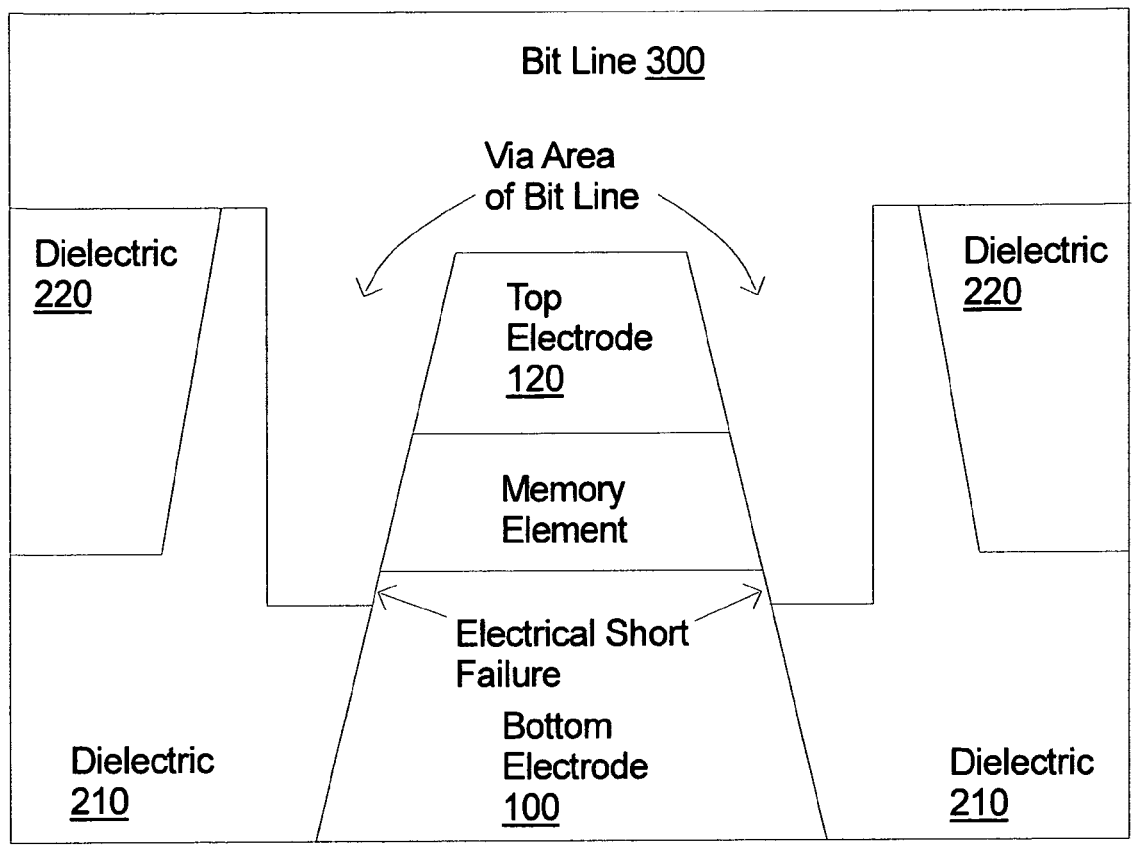
FIG. 1 illustrates a failure condition that can arise during prior art processing of a memory device where the etching of the interconnect via hole has exposed the bottom electrode resulting in a short between the top and bottom electrodes when the metal for the bit line interconnect is deposited.
Figure 2:
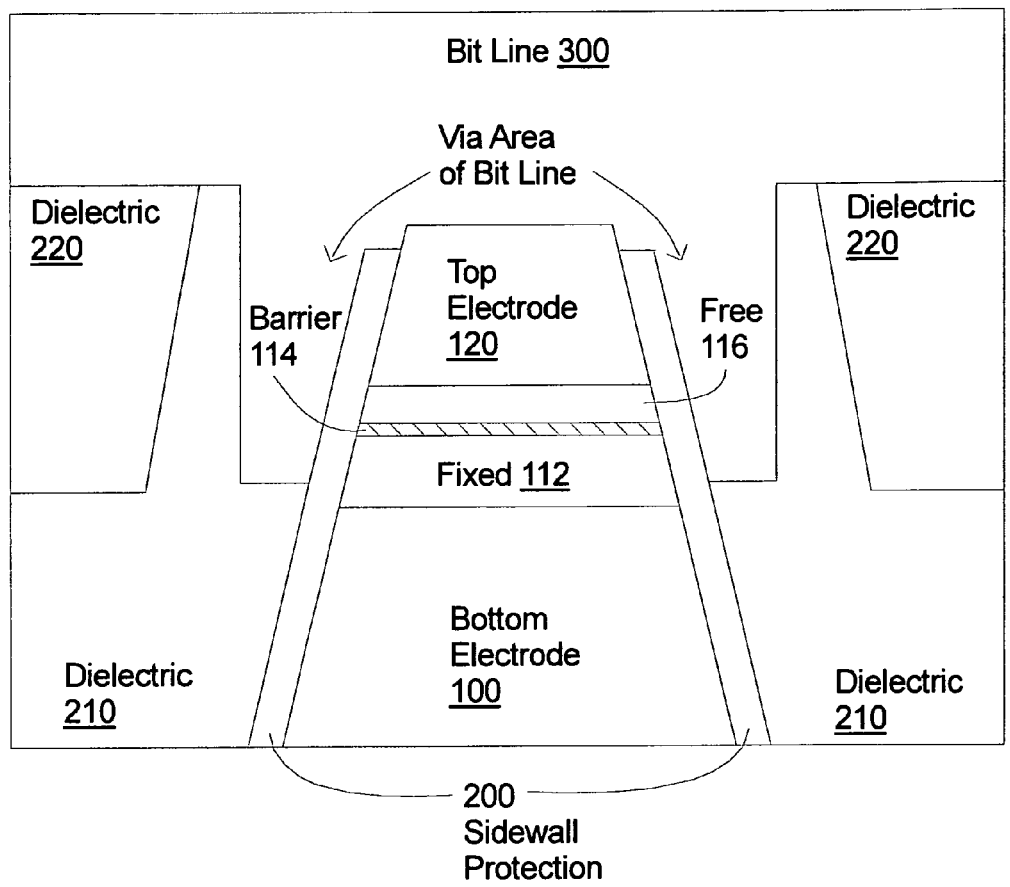
FIG. 2 illustrates a cross sectional view, perpendicular to the substrate surface, of a completed memory cell according to a first embodiment of the invention with a single layer sidewall protection sleeve.

FIG. 2 illustrates a cross sectional view of a completed memory cell according to a first embodiment of the invention wherein the sidewalls of the memory element and bottom electrode are covered by sidewall protection sleeve 200. The material for sidewall protection sleeve 200 is selected to have a relative low etch rate in the etching gas ambient for dielectric 210 and is selected to be, for example, aluminum oxide or a borazinic film. A low dielectric constant borazinic film suitable for general MRAM applications can be deposited by a CVD system such as the MAPLE (Multi Application PLasma Equipment) CVD system of Mitsubishi Heavy Industries.

The sidewall protection layer 200 conforms to the shape of the patterned memory device and in this embodiment is an open-topped elliptical cone shape. After describing the completed device, the process of fabricating the device will be described and illustrated.

The memory device includes a top electrode 120, a bottom electrode 100 and an MTJ element formed by fixed ferromagnetic layer 112, free ferromagnetic layer 116 and barrier layer 114. Multi-layer structures can be substituted for single free and fixed layers in the MTJ as is known in the art. The bottom electrode can be connected to a control device like a transistor or diode (not shown) in the standard manner. The top electrode is electrically connected by metal bit line interconnect 300, which is typically copper. The via area of the bit line interconnect 300 around the centrally located memory device is formed by etching away the etch-stop dielectric layer 210 down below the plane of the upper surface of the top electrode, then refilling with metal as part of the interconnect process. Because the sidewall protection sleeve 200 extends the entire distance from the lower edge of the bottom electrode up onto the sides of the top electrode, the etching depth for the interconnect via in the dielectric layer 210 is less critical than in prior art designs. As long as the via exposes the upper surface of the top electrode, the depth of the via below the plane of the upper surface is not critical. The via could be etched all the way down the bottom electrode without causing a short failure. The invention, therefore, allows for higher yields even with inevitable variations in the etching depth during fabrication. The etch depth for the via in FIG. 2 is shown at approximately the midpoint of the vertical height of the layer stack for the memory device as an example and variations in the depth are to be expected.

The dielectric layer 220 is an inter-layer dielectric (ILD). Low k oxide is often used for the layer 220. An etch-stop layer 210 under ILD 220 works as an etch-stop layer during etching the ILD 220. The dielectric material for layer 210 is selected to have a relatively slow etching rate in the etching ambient gas used for layer 220 etching, and for example, can be silicon nitride or nitrogen doped silicon carbide. A dielectric material is selected for the protection sleeve 200 to be resistant during etching layer 210. Therefore, the protection sleeve 200 should be a different material than layer 210. In embodiments a material such as aluminum oxide or a borazinic film is selected for the sidewall protection sleeve 200, because it has slow etching rate in the typical ambient gas for layer 210 etching. The sidewalls of the memory element and the bottom electrode are covered by sidewall protection sleeve 200, but the upper surface of the top electrode is left exposed to the bit line interconnect 300. The sidewall protection sleeve 200 as shown extends almost to the plane of the upper surface of the top electrode and, therefore, covers most of the sidewall of the top electrode.

The cross section view in FIG. 2 and the other figures is taken through the approximate center the memory cell in a plane perpendicular to the substrate. In a plan view (not shown) parallel to the substrate surface the top electrode 120 and the other layers in the MTJ are generally elliptically shaped and, therefore, the sidewall protection sleeve 200, which conforms to the shape of the MTJ will typically be an elliptically shaped concentric band. However, the shape of the MTJ is not critical for any of the embodiments of the invention, because the sidewall protection sleeve will conform to whatever shape the MTJ has. Thus, the sidewall protection sleeve 200 is a generally a sleeve or ring of material that encircles the sidewalls of the layers of the memory element and the bottom electrode, separates these layers from contact with the surrounding metal material of bit line interconnect 300, and thereby electrically insulates the sidewalls of these layers.

Figure 3:
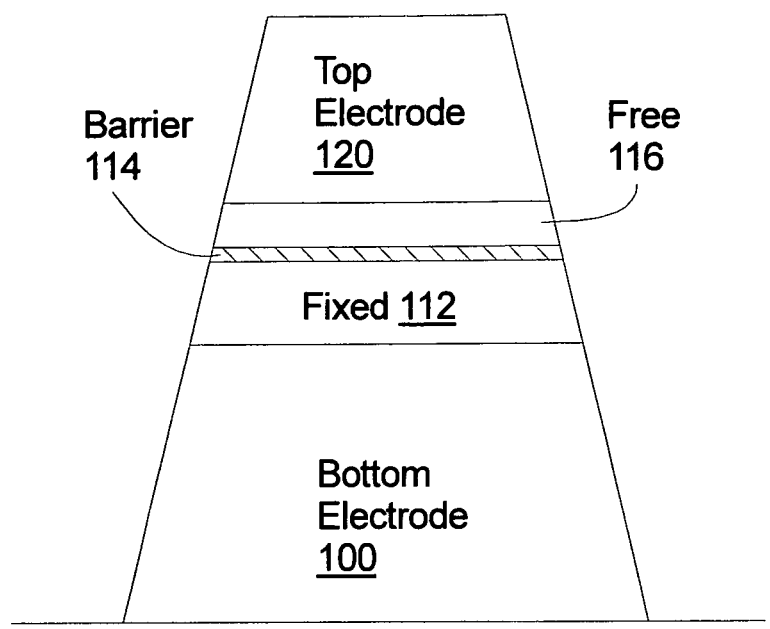

The process of fabricating a memory cell according to the first embodiment invention will be described starting with FIG. 3. A vertical cross sectional illustration after patterning the memory element stack is shown in FIG. 3. The bottom electrode layer 100, MTJ layer stack 112, 114, 116 and the top electrode layer 120 are deposited in sequence. The film stack is then patterned using conventional photolithography and vertical etching.

Figure 4A:
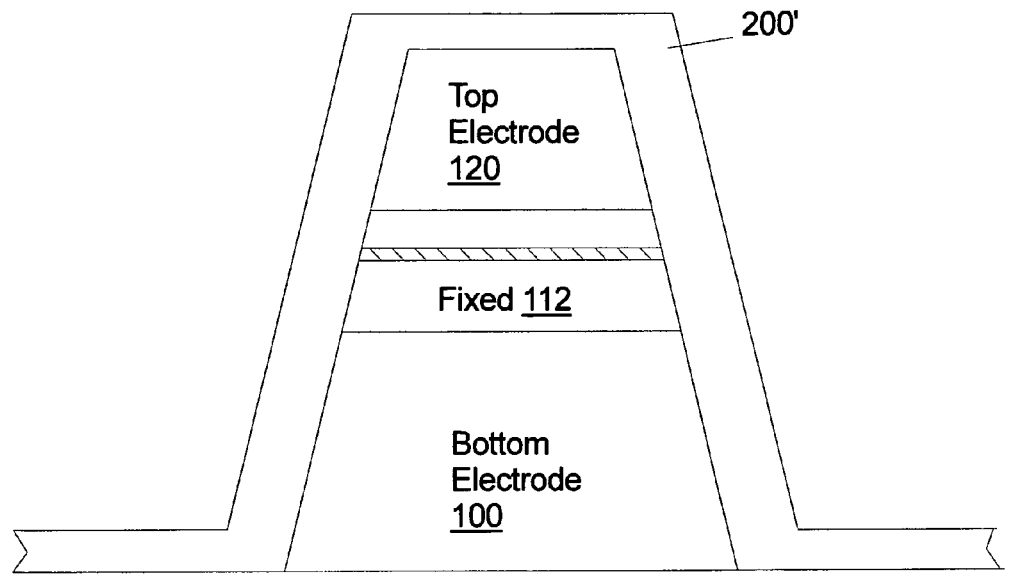
Figure 4B:
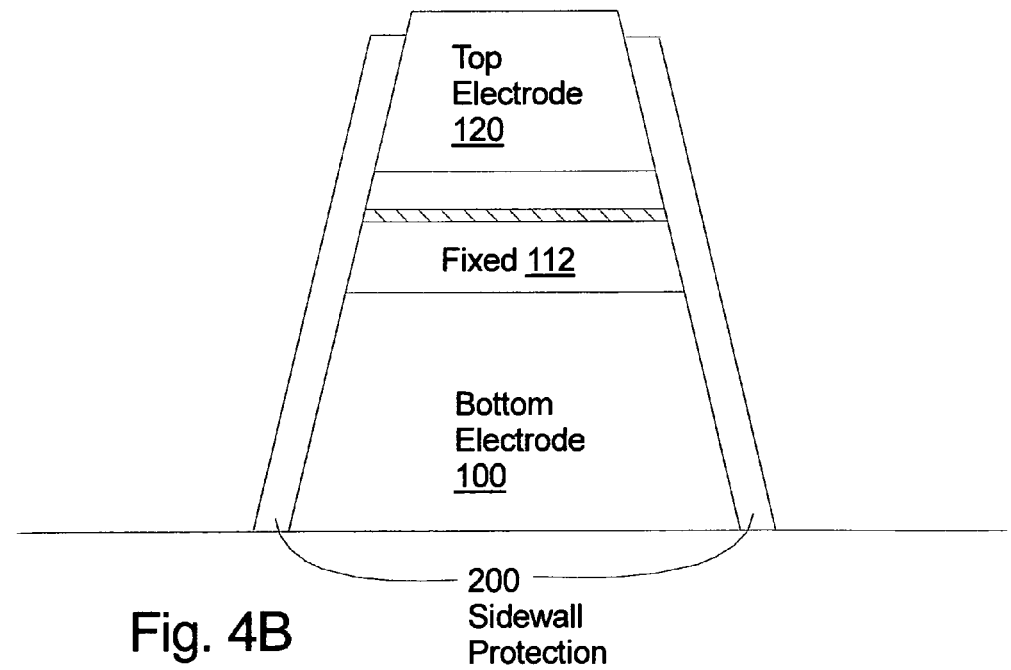

Next a layer 200' is deposited over the film stack as shown in FIG. 4A. This layer provides the bulk material for the sidewall protection structures 200 after controlled etching. The layer 200' is vertically etched until the top electrode 120 is exposed, which leaves residual material on the sidewalls as shown in FIG. 4B forming the sidewall protection sleeve 200. The exposed upper surface of top electrode 120 will be connected to the bit line in later process steps.

Figure 5B:
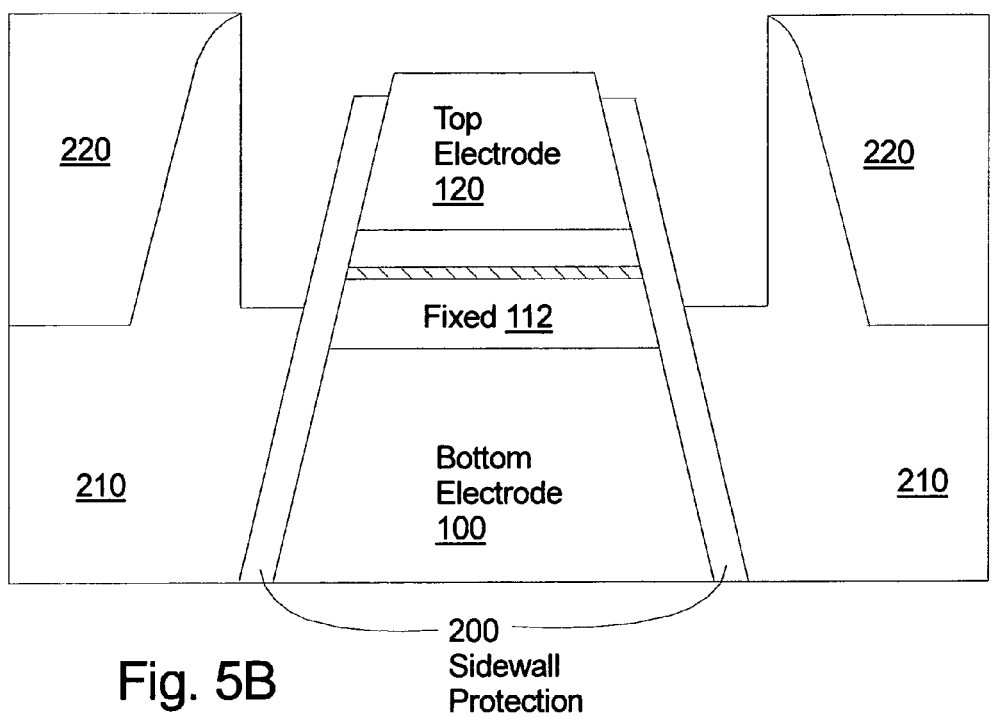

As shown in FIG. 5A, etch stop layer 210 is then deposited over the patterned film stack. Next the ILD oxide layer 220 is deposited. The ILD layer 220 is then planarized by chemical-mechanical polishing (CMP) as shown in FIG. 5A. From the state shown in FIG. 5A, conventional interconnect processing such as Dual Damascene process is used. During the interconnect process, the sidewalls of the memory element and the bottom electrode are protected with the sidewall protection sleeve 200. An exemplary Dual Damascene process can include multiple etch steps. For example, in a one etch, using a photoresist mask defining the via, the exposed portion of the ILD layer 220 overlying the etch stop layer 210 is removed. A subsequent etch removes the etch stop layer 210 from the via area around the memory element stack. During the etching, the memory element stack is protected by sidewall protection sleeve 200 which is resistant to etching ambient used to remove layer 210. The result of the sequence of etching steps is shown in FIG. 5B. As noted above the via etching depth can be shallower or deeper than shown, with the requirement being that the upper surface of the top electrode is exposed. The remainder of the interconnect process is performed including depositing a metal, e.g., copper, over the wafer to form the bit line connection to the top electrode. The result is the memory cell having a sidewall protection sleeve embodiment of the invention as shown in FIG. 2.

Figure 6:
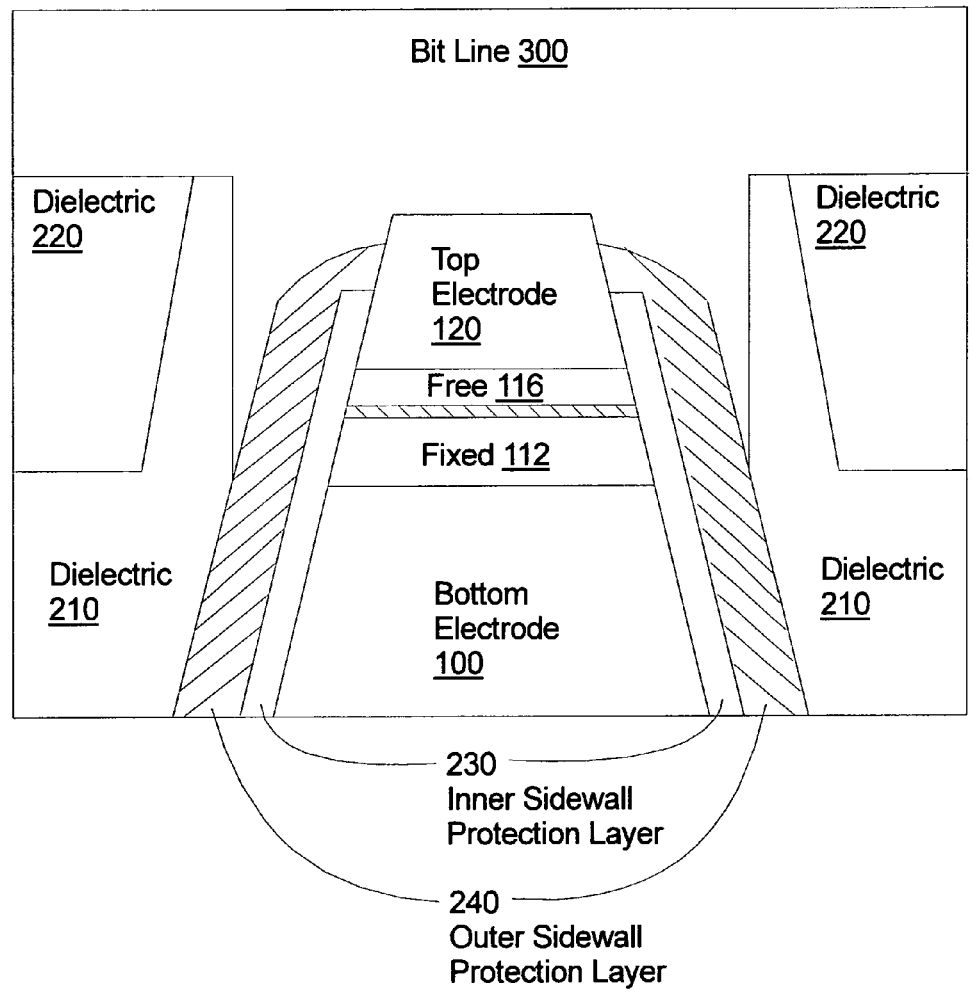
FIG. 6 illustrates a cross sectional view of a completed memory cell according to a second embodiment of the invention with a dual-layer sidewall protection sleeve.

A cross sectional view of the second embodiment of the invention with a dual-layer sidewall protection sleeve is illustrated in FIG. 6. The memory element is the same as in the first embodiment. A first layer 230 of sidewall protection is preferably an oxygen free dielectric to avoid oxidation of the MTJ stack and can be patterned as described above for the first embodiment. The inner sidewall protection layer 230 is in contact with and covers the sidewall of the memory element. As in the first embodiment, the sidewall protection layer 230 conforms to the shape of the patterned memory element which in this embodiment is an open-topped cone.

After the inner sidewall protection layer 230 has been etched down to expose the upper surface of the top electrode, the second sidewall protection layer 240 is deposited over and covers the inner sidewall protection layer 230. For the outer sidewall protection layer 240 a material having a relatively slow etching rate in etching ambient gas used to etch layer 210. The material can be selected to be aluminum oxide or a comparable material. The upper surface of top electrode 120 is not covered with either of the sidewall protection layers to allow connection to the bit line interconnect 300 for standard interconnection.

Figure 7:
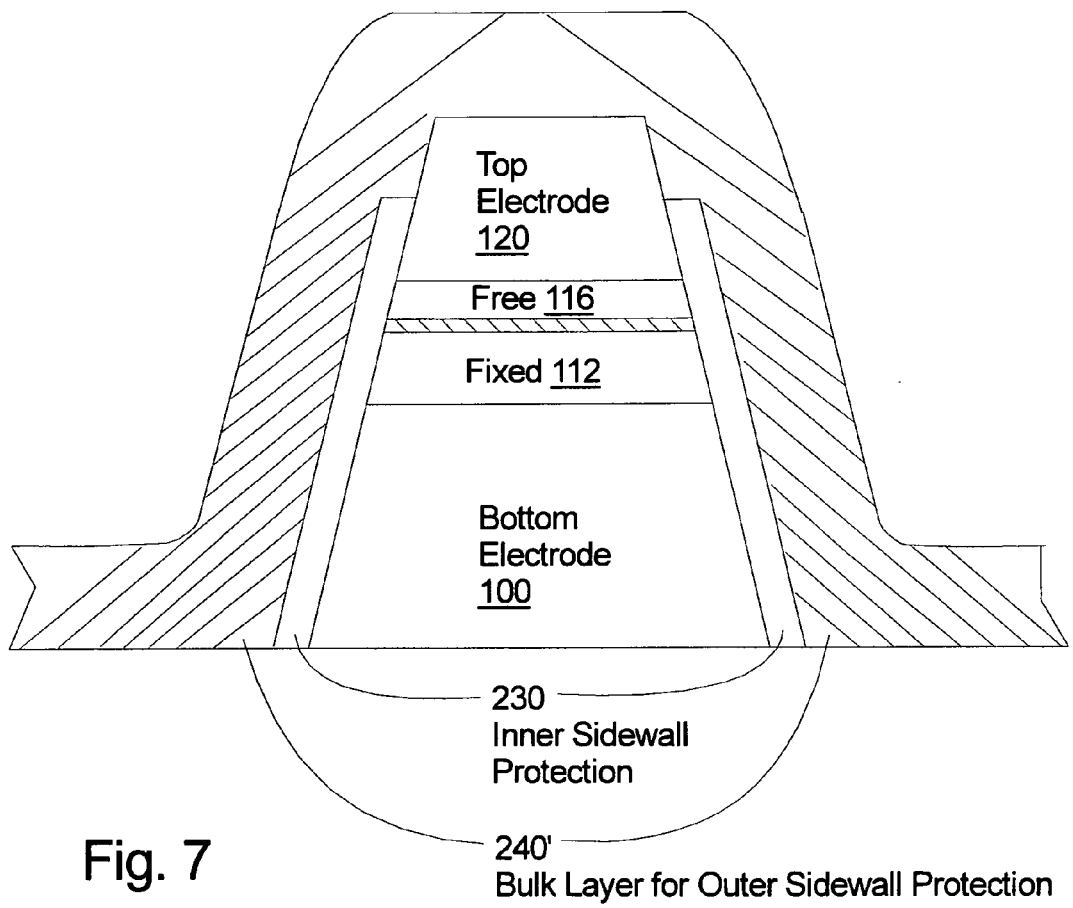
FIGS. 7 and 8 illustrate cross sectional views of selected stages of the fabrication process for a memory cell according to the second embodiment of the invention with a dual-layer sidewall protection sleeve.
Figure 8:
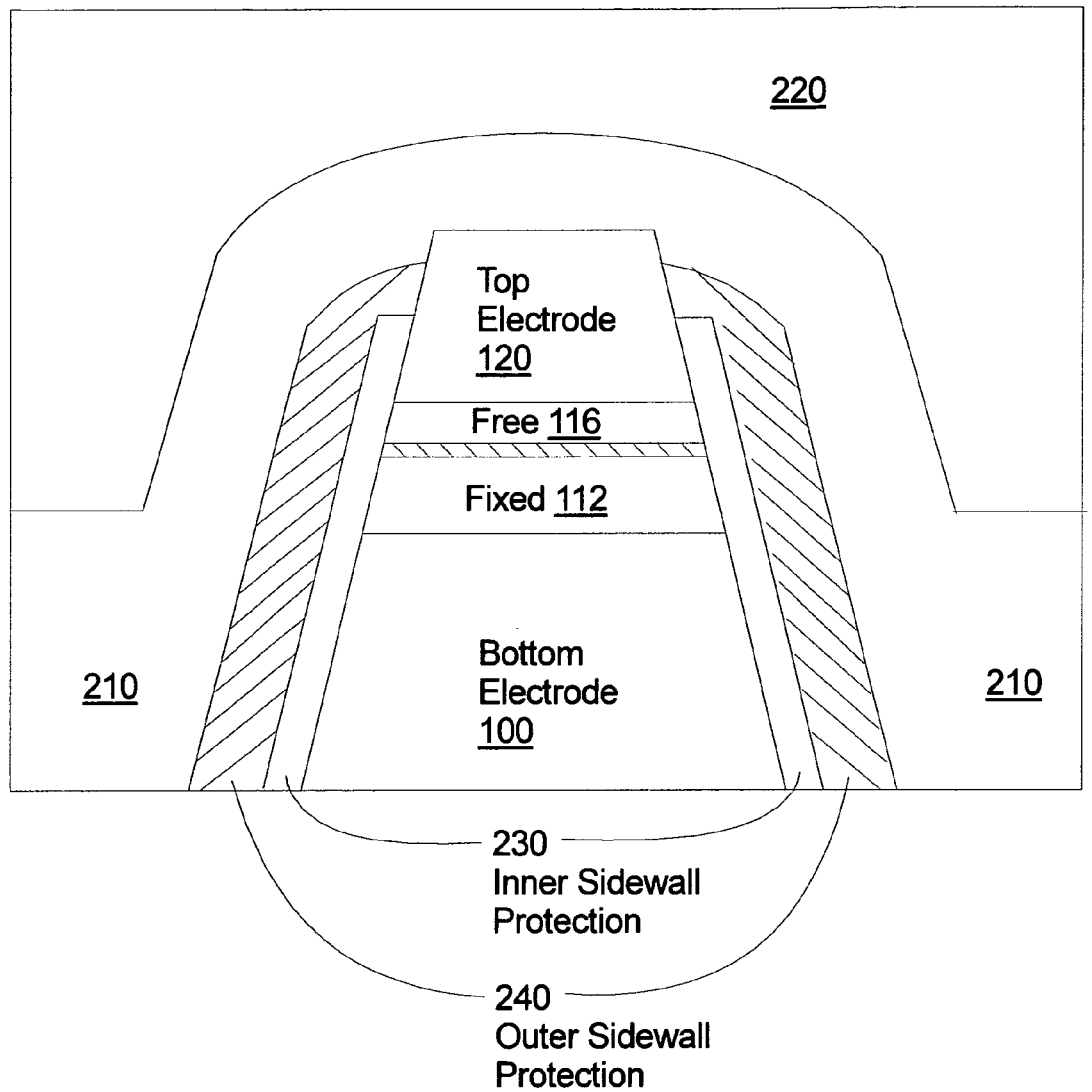

The initial steps in a process according to second embodiment of the invention are generally the same as for the first embodiment, and the first sidewall protection layer 230 can be patterned as described above for layer 200 in the first embodiment. However, the material for the inner sidewall protection layer 230, is preferably an oxygen free dielectric such as silicon nitride or a silicon carbide. A bulk dielectric material 240' is deposited over the wafer and inner protection layer 230 as shown in FIG. 7 which will be patterned into the outer sidewall protection layer 240. The material for the outer sidewall protection layer 240 is preferably aluminum oxide or borazinic film or a comparable material. The outer sidewall protection layer 240 protects the inner sidewall protection layer 230 during the interconnect process. The outer sidewall protection layer 240 is vertically etched until top of the memory element is exposed to allow interconnection with the bit line as shown in FIG. 8. The process continues in the conventional manner after the outer sidewall protection layer 240 is vertically etched. Etch stop layer 210 and ILD oxide layer 220 are deposited sequentially. ILD 220 is planarized by CMP as shown in FIG. 8. It is followed by conventional interconnect processing such as a Dual Damascene process. After this processing, a memory cell having dual sidewall protection layers is completed as shown in FIG. 6. During the interconnect process, the outer sidewall protection layer 240 protects the inner sidewall protection layer 230 covering the sidewall of the memory element and thereby protects the memory element.

The invention claimed is:

1. A memory cell comprising:
   a memory device stack including a top electrode, a memory element having a plurality of layers, and a bottom electrode;
   a sidewall protection sleeve of a first dielectric material encircling sidewalls of the memory element, the bottom electrode, and a lower portion of the top electrode, the sidewall protection sleeve generally conforming to a shape of the memory element in a plane parallel to a surface of a substrate and having a generally conical shape with an open top through which an upper surface of the top electrode protrudes; and
   a metal bit line interconnect in electrical contact with the upper surface of the top electrode, the metal bit line interconnect being formed in a via that is wider than the upper surface of top electrode and extends below an upper edge of the sidewall protection sleeve, the metal bit line interconnect covering the upper surface of the top electrode and extending down below a plane of the upper surface of the top electrode to make contact with and surround an upper portion of the sidewall protection sleeve.

2. The memory cell of claim 1 further comprising an etch-stop layer that forms at least a portion of sidewalls of the via for the metal bit line interconnect and the etch stop layer making contact with a lower portion of the sidewall protection sleeve below the via, the etch-stop layer consisting of a selected dialectic material, and wherein the first dielectric material in the sidewall protection sleeve has a lower etching rate than the selected dielectric material in the etch-stop layer in a selected etching gas used to etch the etch-stop layer to create the via for the metal bit line interconnect.

3. The memory cell of claim 1 wherein the sidewall protection sleeve includes a layer of aluminum oxide.

4. The memory cell of claim 1 wherein the sidewall protection sleeve includes a layer of a borazinic film.

5. The memory cell of claim 1 wherein the sidewall protection sleeve substantially covers a sidewall of the top electrode.

6. The memory cell of claim 1 wherein the sidewall protection sleeve includes an outer layer of the first dielectric material and an inner layer of a second dielectric material and wherein the inner layer is in contact with the sidewalls of the memory element and the bottom electrode.

7. The memory cell of claim 6 wherein the inner layer is an oxygen-free dielectric.

8. The memory cell of claim 7 wherein the outer layer is aluminum oxide.

9. The memory cell of claim 7 wherein the outer layer is a borazinic film.

* * * * *